(12) United States Patent
Shin et al.

(10) Patent No.: US 12,484,395 B2
(45) Date of Patent: Nov. 25, 2025

(54) DISPLAY DEVICE INCLUDING PAD PART WITH DIFFERENT WIDTHS

(71) Applicant: Samsung Display Co., Ltd., Yongin-si (KR)

(72) Inventors: Kihae Shin, Cheonan-si (KR); Dongwan Choi, Seoul (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 436 days.

(21) Appl. No.: 17/740,734

(22) Filed: May 10, 2022

(65) Prior Publication Data
US 2023/0070684 A1    Mar. 9, 2023

(30) Foreign Application Priority Data
Sep. 3, 2021 (KR) ................. 10-2021-0117693

(51) Int. Cl.
*H10K 59/131* (2023.01)
*H05K 1/18* (2006.01)

(52) U.S. Cl.
CPC .......... *H10K 59/131* (2023.02); *H05K 1/189* (2013.01); *H05K 2201/10128* (2013.01)

(58) Field of Classification Search
CPC ...... H10K 59/131; H10K 59/82; H05K 1/189; H05K 2201/10128; H05K 2201/09027
USPC ........................................................... 257/40
See application file for complete search history.

(56) References Cited

U.S. PATENT DOCUMENTS

| | | | |
|---|---|---|---|
| 2017/0371376 A1* | 12/2017 | Chung | .............. G02F 1/133305 |
| 2018/0108292 A1* | 4/2018 | Xu | .................... H05K 1/189 |
| 2021/0231995 A1* | 7/2021 | Lu | .................... G02F 1/133308 |

FOREIGN PATENT DOCUMENTS

| | | | | |
|---|---|---|---|---|
| CN | 111208684 A | * | 5/2020 | ......... G02F 1/13452 |
| KR | 100788199 B1 | | 12/2007 | |
| KR | 1020160129494 A | | 11/2016 | |
| KR | 1020180030326 A | | 3/2018 | |

* cited by examiner

*Primary Examiner* — Norman D Richards
*Assistant Examiner* — Laura M Dykes
(74) *Attorney, Agent, or Firm* — CANTOR COLBURN LLP

(57) ABSTRACT

A display device includes a substrate including a display part having a first width in a first direction and a pad part protruding from the display part in a second direction crossing the first direction and having a second width in the first direction, the second width being smaller than the first width, and a printed circuit board having a concave-convex shape towards the substrate. As the printed circuit board has the concave-convex shape, a dead space of the display device is reduced.

15 Claims, 10 Drawing Sheets

DISPLAY DEVICE INCLUDING PAD PART WITH DIFFERENT WIDTHS

This application claims priority to Korean Patent Application No. 10-2021-0117693, filed on Sep. 3, 2021, and all the benefits accruing therefrom under 35 U.S.C. § 119, the content of which in its entirety is herein incorporated by reference.

BACKGROUND

Field

Embodiments of the invention relate generally to a display device and a method of manufacturing the display device. More specifically, embodiments of the invention relate to a flexible display device and a method of the flexible display device.

Description of the Related Art

A display device is divided into a display area and a non-display area (e.g., a dead space). An image is displayed in the display area, and fan-out line, a pad, a printed circuit board, or the like are disposed in the non-display area. The printed circuit board generates a signal for driving the display area, and transmits the signal to the display area through the pad and the fan-out line.

SUMMARY

Since a user recognizes an image through a display area, when a non-display area is recognized by the user, user's immersion level may be reduced.

Embodiments provide a display device with reduced dead space.

A display device in an embodiment may include a substrate including a display part having a first width in a first direction and a pad part protruding from the display part in a second direction crossing the first direction and having a second width in the first direction, the second width being smaller than the first width, and a printed circuit board adjacent to the substrate in the second direction and having a concave-convex shape towards the substrate.

In an embodiment, in a plan view, the pad part may have a trapezoidal shape with a curved side surface.

In an embodiment, the second width of the pad part in the first direction may decrease as a distance from the display part increases.

In an embodiment, the pad part may have a trapezoidal shape with a straight side surface.

In an embodiment, the second width of the pad part in the first direction may decrease as a distance from the display part increases.

In an embodiment, the pad part may have a quadrangular (e.g., rectangular) shape.

In an embodiment, the display device may further include a pad disposed on the pad part.

In an embodiment, the pad part may be electrically connected to the display part.

In an embodiment, the substrate may further include a fan-out part disposed between the display part and the pad part.

In an embodiment, the display device may further include a fan-out line disposed on the fan-out part and electrically connecting the display part and the pad part.

In an embodiment, the concave-convex shape may include a concave portion overlapping the pad part in the second direction and a convex portion spaced apart from the pad part in the second direction.

In an embodiment, the convex portion may overlap the pad part in the first direction.

In an embodiment, the concave-convex shape may be provided along a shape of the pad part.

In an embodiment, the convex portion may have a trapezoidal shape with a straight side surface.

In an embodiment, the convex portion may have a rectangular shape.

In an embodiment, the display device may further include a flexible printed circuit board connecting the substrate and the printed circuit board.

In an embodiment, the flexible printed circuit board may be disposed at an end portion of the pad part.

In an embodiment, the display device may further include a transistor disposed on the display part and electrically connected to the pad part, a first electrode disposed on the transistor and electrically connected to the transistor, an emission layer disposed on the first electrode, and a second electrode disposed on the emission layer.

Therefore, a display device in embodiments may include a substrate and a printed circuit board. The substrate may include a display part and a pad part protruding from the display part. The pad part may have a trapezoidal shape, a rectangular shape, or the like. The printed circuit board may have the concave-convex shape, and the concave-convex shape may be formed along the shape of the pad part. The printed circuit board may be disposed by the space between the pad part. Accordingly, a dead space of the display device may be reduced.

It is to be understood that both the foregoing general description and the following detailed description are examples and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention together with the description.

DETAILED DESCRIPTION

Figure 1:
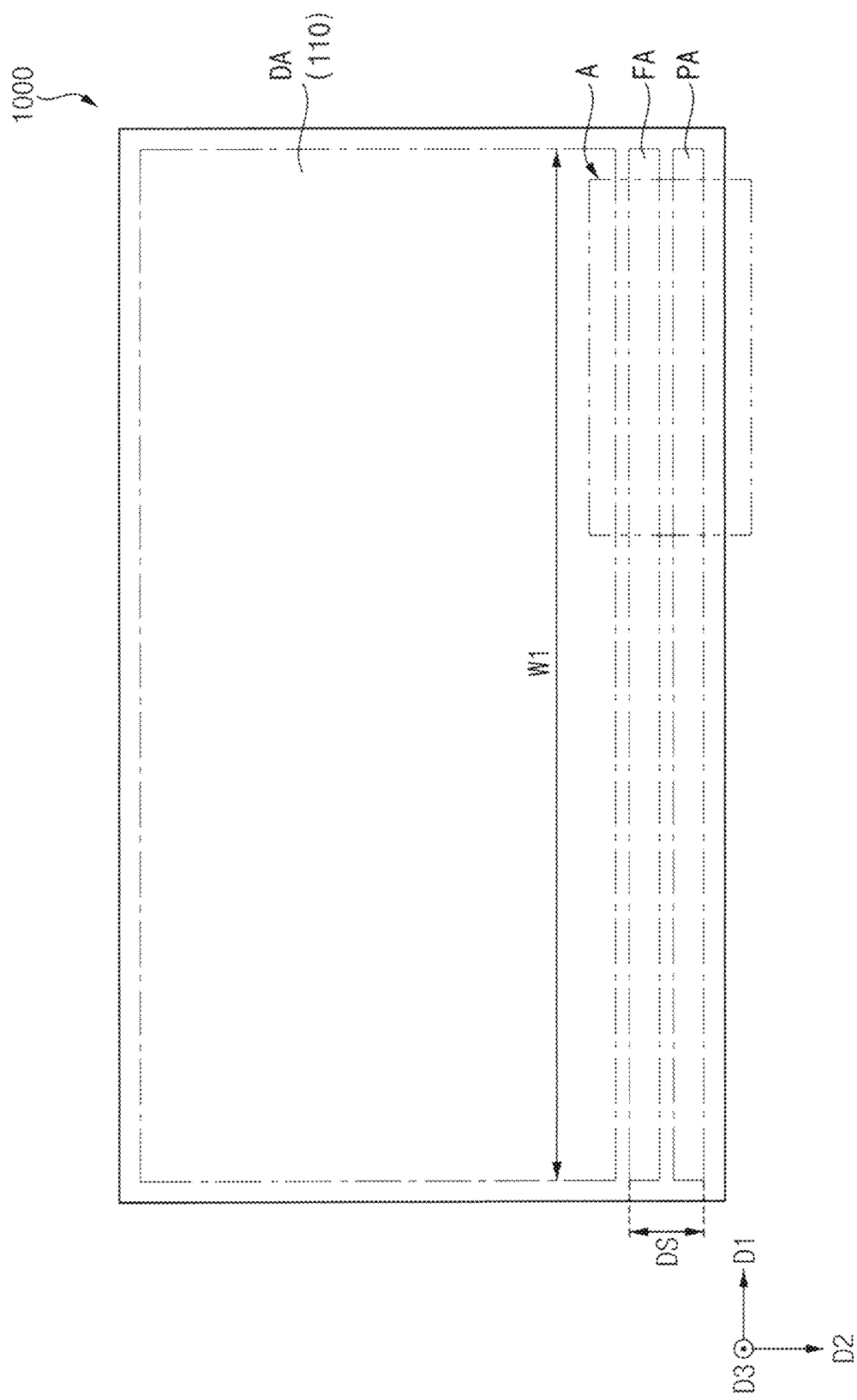
FIG. 1 is a plan view illustrating an embodiment of a display device.

Illustrative, non-limiting embodiments will be more clearly understood from the following detailed description in conjunction with the accompanying drawings.

It will be understood that when an element is referred to as being "on" another element, it can be directly on the other element or intervening elements may be therebetween. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or" As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. In an embodiment, when the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, when the device in one of the figures is turned over, elements described as "below" or "beneath" other elements would then be oriented "above" the other elements. The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). The term "about" can mean within one or more standard deviations, or within +30%, 20%, 10%, 5% of the stated value, for example.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the invention, and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. In an embodiment, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the claims.

FIG. 1 is a plan view illustrating an embodiment of a display device.

Referring to FIG. 1, a display device 1000 in an embodiment may include a display area DA, a fan-out area FA, and a pad area PA.

The display area DA may be an area in which an image is displayed. In an embodiment, a display panel PNL may be disposed in the display area DA, and the display panel PNL may receive a voltage and/or a signal provided to the display area DA, for example. The display panel PNL may emit light based on the voltage and/or the signal. In an embodiment, the display area DA may have a quadrangular (e.g., rectangular) shape, for example.

The fan-out area FA may be an area transmitting the voltage and/or the signal to the display area DA. In an embodiment, at least one fan-out line (e.g., a fan-out line FL in FIG. 2) may be disposed in the fan-out area FA, for example. The fan-out line may transfer the voltage and/or the signal from the pad area PA to the display area DA. In an embodiment, the fan-out area FA may be adjacent to the display area DA in the second direction D2.

The pad area PA may be an area generating the voltage and/or the signal. In an embodiment, the pad area PA may be adjacent to the fan-out area FA in the second direction D2. In other words, the fan-out area FA may be disposed between the display area DA and the pad area PA. In an embodiment, a length of a dead space DS in the second direction D2 may correspond to a length between a side (e.g., an upper side in FIG. 1) of fan-out area FA facing the display area DA and a side (e.g., a lower side in FIG. 1) of the pad area PA facing opposite to the display area DA.

Figure 2:
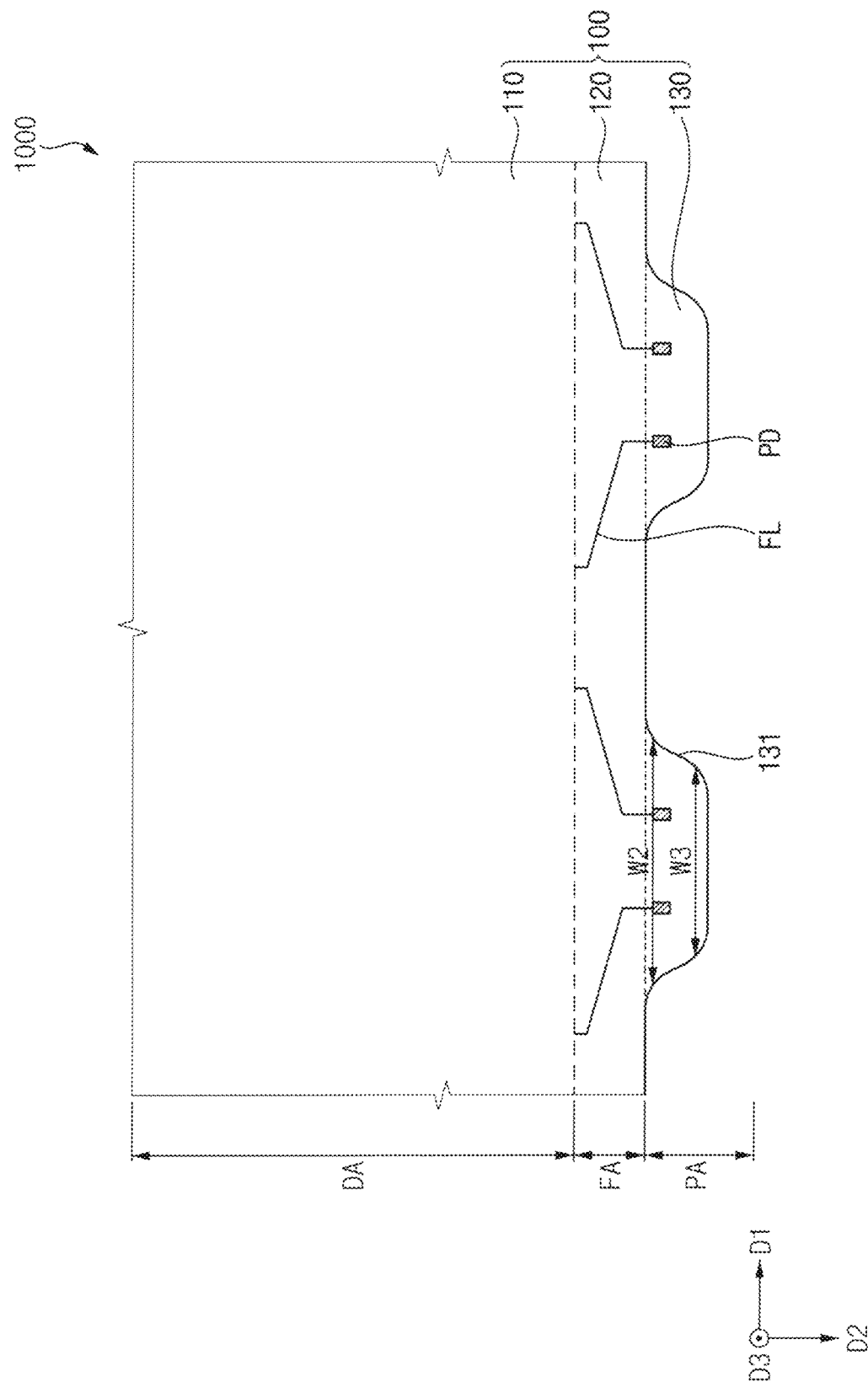
FIG. 2 is an enlarged view illustrating a substrate included in the display device of FIG. 1.
Figure 3:
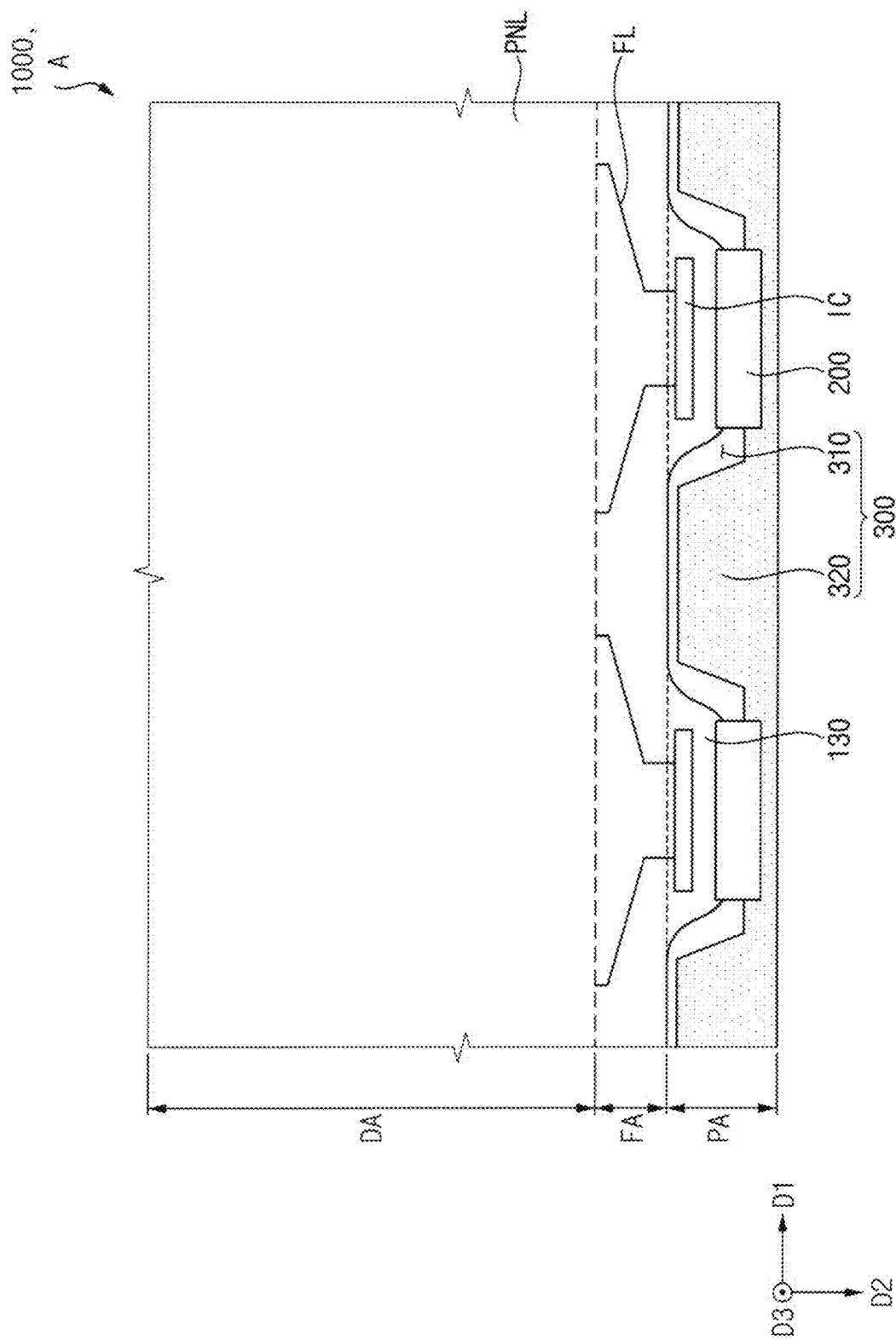
FIG. 3 is an enlarged view illustrating the display device of FIG. 1.

FIG. 2 is an enlarged view illustrating a substrate included in the display device of FIG. 1. FIG. 3 is an enlarged view illustrating the display device of FIG. 1. FIG. 3 is an enlarged view illustrating an embodiment of area "A" of FIG. 1, for example.

Referring to FIG. 2, the display device 1000 may include a substrate 100. The substrate 100 may include a display part 110, a fan-out part 120, and a pad part 130.

The display part 110 may overlap the display area DA. In an embodiment, the display part 110 may have substantially a same shape as that of the display area DA. In addition, as shown in FIG. 1, the display part 110 may have a first width W1 in a first direction D1 crossing the second direction D2.

The fan-out part 120 may overlap the fan-out area FA. In an embodiment, the fan-out part 120 may be adjacent to the display part 110 in the second direction D2. At least one fan-out line FL may be disposed on the fan-out part 120. The fan-out line FL may be electrically connected to the display part 110.

The pad part 130 may overlap the pad area PA. In an embodiment, the pad part 130 may protrude from the display part 110 in the second direction D2. At least one pad PD may be disposed on the pad part 130. The pad PD may be electrically connected to the fan-out line FL. In other words, the pad part 130 may be electrically connected to the display part 110 through the pad PD and the fan-out line FL.

The display part 110, the fan-out part 120, and the pad part 130 may be unitary with each other. In other words, the substrate 100 may be formed or provided by cutting a quadrangular (e.g., rectangular) mother substrate having a larger area than that of the substrate 100. In the process of cutting the mother substrate, the substrate 100 may be formed or provided such that the substrate 100 includes the pad part 130 described above.

In an embodiment, the pad part 130 may have a second width W2 and a third width W3. The second width W2 may be a width of the pad part 130 adjacent to the fan-out part 120, and the third width W3 may be a width of the pad part 130 spaced apart from the fan-out part 120. As shown in FIGS. 1 and 2, the second width W2 and the third width W3 may be smaller than the first width W1.

In an embodiment, in a plan view, the pad part 130 may have a trapezoidal shape. In an embodiment, the width of the pad part 130 in the first direction D1 may decrease as the distance from the display part 110 increases, for example. In other words, the third width W3 may be smaller than the second width W2.

In addition, in an embodiment, a side surface 131 of the trapezoidal shape may be curved. In other words, the shape of the pad part 130 adjacent to the fan-out part 120 may be rounded. Accordingly, the rigidity of the pad part 130 may be improved.

Referring to FIG. 3, the display device 1000 may include the display panel PNL, a driving chip IC, a flexible printed circuit board 200, and a printed circuit board 300.

The display panel PNL may be disposed on the substrate 100 and may overlap the display area DA. The display panel PNL may be electrically connected to the pad PD (refer to FIG. 2) through the fan-out line FL. Accordingly, the display panel PNL may receive the voltage and/or the signal from the pad PD.

The driving chip IC may be disposed on the pad PD and may be electrically connected to the pad PD. In an embodiment, the driving chip IC may directly contact the pad PD, for example. The driving chip IC may be electrically connected to the flexible printed circuit board 200 and may receive a driving signal from the flexible printed circuit board 200.

In an embodiment, the driving chip IC may be a data driving circuit that determines luminance of pixels included in the display panel PNL. In an embodiment, the driving chip IC may receive image data and a data driving signal from the printed circuit board 300, and may generate a data voltage, for example. The data voltage may be transmitted to the display part 110 through the pad PD and the fan-out line FL.

In another embodiment, the driving chip IC may be a gate driving circuit that determines the emission timing of the pixels. In an embodiment, the driving chip IC may receive a gate driving signal from the printed circuit board 300 and may generate a gate signal, for example. The gate signal may be transmitted to the display part 110 through the pad PD and the fan-out line FL.

However, the driving chip IC is not limited thereto. In an embodiment, the driving chip IC may be any chip that transmits the voltage and/or the signal to the display part 110, for example.

The flexible printed circuit board 200 may connect the substrate 100 and the printed circuit board 300. In an embodiment, a plurality of transfer patterns may be formed or provided on the flexible printed circuit board 200, for example. The flexible printed circuit board 200 may have flexibility. In an embodiment, the flexible printed circuit board 200 may have a structure in which a conductive material including a copper foil is coated on a surface of a flexible base film, for example. In an embodiment, the flexible printed circuit board 200 may be disposed at an end portion of the pad part 130. In other words, a part of the flexible printed circuit board 200 may contact the end portion of the pad part 130, and another part of the flexible printed circuit board 200 may contact the printed circuit board 300.

The printed circuit board 300 may overlap the pad area PA of the display device 1000. The printed circuit board 300 may be electrically connected to the driving chip IC and may include a timing control circuit, a power supply circuit, or the like. The timing control circuit may generate the image data, the data driving signal, the gate driving signal, or the like, based on an image signal received from an external device. In addition, the printed circuit board 300 may further include a communication circuit for connecting the display device 1000 to the external device (e.g., graphics processing unit ("GPU")).

In an embodiment, the printed circuit board 300 may be adjacent to the pad part 130 in the second direction D2. In addition, the printed circuit board 300 may include a concave-convex shape towards the substrate 100. In other words, the printed circuit board 300 may include the concave-convex shape facing the pad part 130. In an embodiment, one surface of the printed circuit board 300 may have the concave-convex shape, and the other surface of the printed circuit board 300 may have a linear shape, for example.

The concave-convex shape may be formed or provided along the shape of the pad part 130. In an embodiment, the concave-convex shape may include a concave portion 310 and a convex portion 320, for example.

The concave portion 310 may correspond to the pad part 130. In other words, the concave portion 310 may overlap the pad part 130 in the second direction D2. In an embodiment, the concave portion 310 may be a space in which the pad part 130 is disposed, for example. In addition, as shown in FIG. 3, the concave portion 310 may have a trapezoidal shape with a straight side surface.

The convex portion 320 may be spaced apart from the pad part 130 in the second direction D2 and may overlap the pad part 130 in the first direction D1. The convex portion 320 may be adjacent to the concave portion 310 and may be a portion defined between the concave portions 310. In an embodiment, the convex portion 320 may be a portion protruding toward the substrate 100, for example. In addition, as shown in FIG. 3, the convex portion 320 may have a trapezoidal shape with a straight side surface.

In an embodiment, a semiconductor element (e.g., a processor, a capacitor, a resistor, etc.) may be disposed on the convex portion 320. The semiconductor element may implement the timing control circuit, the power supply circuit, the communication circuit, or the like.

Figure 4:
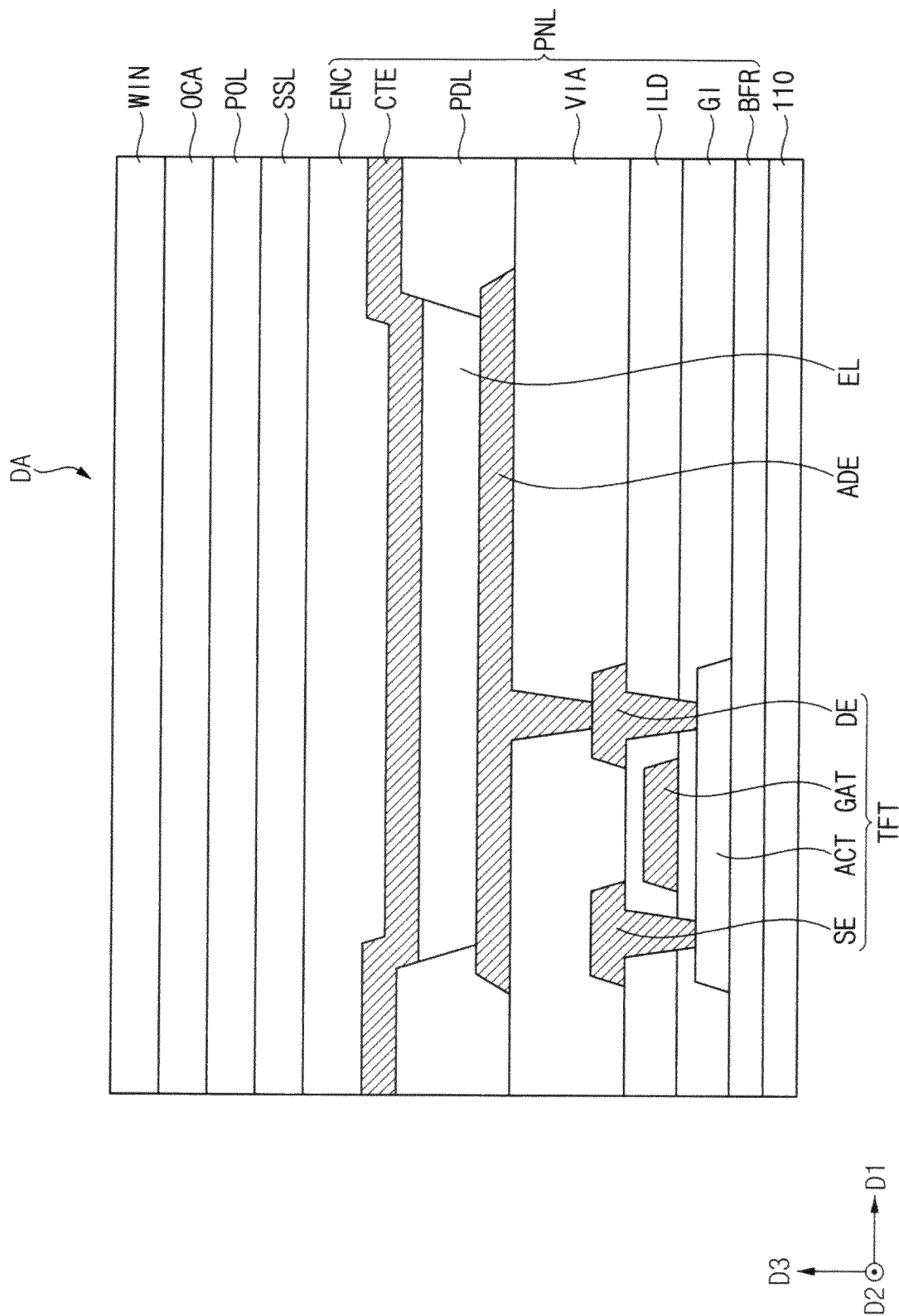
FIG. 4 is a cross-sectional view illustrating the display device of FIG. 1.

FIG. 4 is a cross-sectional view illustrating the display device of FIG. 1.

Referring to FIG. 4, the display device 1000 may include the display part 110, the display panel PNL, a sensing layer SSL, a polarization layer POL, an adhesive layer OCA, and a window WIN. The display panel PNL may include a buffer layer BFR, a transistor TFT, a gate insulating layer GI, an inter-insulating layer ILD, a via-insulating layer VIA, a first electrode ADE, a pixel defining layer PDL, an emission layer EL, a second electrode CTE, and an encapsulation layer ENC. The transistor TFT may include an active pattern ACT, a gate electrode GAT, a source electrode SE, and a drain electrode DE.

The display part 110 may include a transparent or opaque material. In an embodiment, the material that may be used as the display part 110 may include glass, quartz, plastic, or the like. These may be used alone or in combination with each other. In addition, the display part 110 may be configured as a single layer or as a multi-layer in combination with each other.

The buffer layer BFR may be disposed on the display part 110. The buffer layer BFR may prevent metal atoms, atoms, or impurities from diffusing from the display part 110 into the active pattern ACT. In addition, the buffer layer BFR may control a heat supply rate during a crystallization process for forming the active pattern ACT.

The active pattern ACT may be disposed on the buffer layer BFR. In an embodiment, the active pattern ACT may include a channel region, a source region, and a drain region. The channel region may be disposed between the source region and the drain region. The active pattern ACT may include a silicon semiconductor material or an oxide semiconductor material. In an embodiment, the silicon semiconductor material that may be used as the active pattern ACT may include amorphous silicon, polycrystalline silicon, or the like. In an embodiment, the oxide semiconductor material that may be used as the active pattern ACT may include indium gallium zinc oxide ("IGZO") (InGaZnO), indium tin zinc oxide ("ITZO") (InSnZnO), or the like. In addition, the oxide semiconductor material may further include indium ("In"), gallium ("Ga"), tin ("Sn"), zirconium ("Zr"), vanadium ("V"), hafnium ("Hf"), cadmium ("Cd"), germanium ("Ge"), chromium ("Cr"), titanium ("Ti"), and zinc ("Zn"). These may be used alone or in combination with each other. However, the material forming the active pattern ACT is not limited thereto.

In an embodiment, the gate insulating layer GI may be disposed on the active pattern ACT and may cover the active pattern ACT. In an embodiment, the gate insulating layer GI may include an insulating material. In an embodiment, the insulating material that may be used as the gate insulating layer GI may include silicon oxide, silicon nitride, silicon oxynitride, or the like. These may be used alone or in combination with each other. However, the material forming the gate insulating layer GI is not limited thereto.

The gate electrode GAT may be disposed on the gate insulating layer GI and may overlap the channel region of the active pattern ACT. In an embodiment, the gate electrode GAT may include a metal, an alloy, a conductive metal oxide, a transparent conductive material, or the like. In an embodiment, the material that may be used as the gate electrode GAT may include silver ("Ag"), an alloy including silver, molybdenum ("Mo"), an alloy including molybdenum, aluminum ("Al"), an alloy including aluminum, tantalum ("Ta"), platinum ("Pt"), scandium ("Sc"), indium tin oxide ("ITO"), indium zinc oxide ("IZO"), or the like. These may be used alone or in combination with each other. In addition, the gate electrode GAT may be configured as a single layer or as a multi-layer in combination with each other. However, the material for forming the gate electrode GAT is not limited thereto.

In an embodiment, the inter-insulating layer ILD may be disposed on the gate electrode GAT and may cover the gate electrode GAT. In an embodiment, the inter-insulating layer ILD may include an insulating material. In an embodiment, the insulating material that may be used as the inter-insulating layer ILD may include silicon oxide, silicon nitride, silicon is oxynitride, or the like. These may be used alone or in combination with each other. In addition, the inter-insulating layer ILD may be configured as a single layer or as a multi-layer in combination with each other. However, the material forming the inter-insulating layer ILD is not limited thereto.

In another embodiment, the gate insulating layer GI may cover the channel region of the active pattern ACT. In this case, the inter-insulating layer ILD may cover the source region and the drain region of the active pattern ACT.

The source electrode SE and the drain electrode DE may be disposed on the inter-insulating layer ILD. Each of the source electrode SE and the drain electrode DE may contact the active pattern ACT. In an embodiment, the source electrode SE and the drain electrode DE may include a metal, an alloy, a conductive metal oxide, a transparent conductive material, or the like. In addition, each of the source electrode SE and the drain electrode DE may be configured as a single layer or in combination with each other to form a multilayer structure. However, the material for forming the source electrode SE and the drain electrode DE is not limited thereto.

The active pattern ACT, the gate electrode GAT, the source electrode SE, and the drain electrode DE may constitute the transistor TFT. The transistor TFT may be electrically connected to the pad part 130. In other words, the transistor TFT may be electrically connected to the driving chip IC through the fan-out line FL.

The via-insulating layer VIA may be disposed on the source electrode SE and the drain electrode DE, and may cover the source electrode SE and the drain electrode DE. The via-insulating layer VIA may include an insulating material. In an embodiment, the insulating material that may be used as the via-insulating layer VIA may include photoresist, polyacrylic resin, polyimide resin, acrylic resin, or the like. These may be used alone or in combination with each other. However, the material for forming the via-insulating layer VIA is not limited thereto.

The first electrode ADE may be disposed on the via-insulating layer VIA. In an embodiment, the first electrode ADE may be electrically connected to the transistor TFT. In an embodiment, the first electrode ADE may contact the drain electrode DE. The first electrode ADE may include a metal, an alloy, a conductive metal oxide, a transparent conductive material, or the like. However, the material forming the first electrode ADE is not limited thereto.

The pixel defining layer PDL may be disposed on the via-insulating layer VIA, and an opening exposing the first electrode ADE may be defined in the pixel defining layer PDL. The pixel defining layer PDL may include an insulating material. In an embodiment, the insulating material that may be used as the pixel defining layer PDL may include photoresist, polyacrylic resin, polyimide resin, acrylic resin, or the like. These may be used alone or in combination with each other. However, the material for forming the pixel defining layer PDL is not limited thereto.

The emission layer EL may be disposed on the first electrode ADE. In an embodiment, the emission layer EL may be disposed in the opening, for example. The emission layer EL may generate light based on a potential difference between the first electrode ADE and the second electrode CTE.

The second electrode CTE may be disposed on the emission layer EL. The second electrode CTE may be implemented as a plate electrode, and may include a metal, an alloy, a conductive metal oxide, a transparent conductive material, or the like. However, the material forming the second electrode CTE is not limited thereto.

The encapsulation layer ENC may be disposed on the second electrode CTE. The encapsulation layer ENC may include an insulating material. The encapsulation layer ENC may include a single layer or multiple layers. When the encapsulation layer ENC has a multilayer structure, the encapsulation layer ENC may have a structure in which inorganic layers and organic layers are alternately stacked. The encapsulation layer ENC may prevent foreign matter from penetrating into the emission layer EL.

The sensing layer SSL may be disposed on the encapsulation layer ENC. In an embodiment, the sensing layer SSL may include a first sensing electrode extending in the first direction D1 and a second sensing electrode extending in the second direction D2. The first sensing electrode and the second sensing electrode may be formed or disposed in different layers, and a capacitance may be generated between the first sensing electrode and the second sensing electrode. The sensing layer SSL may sense a user's touch through the amount of change in the capacitance.

However, the first sensing electrode and the second sensing electrode may be formed or disposed in the same layer. In another embodiment, the sensing layer SSL may be omitted.

The polarization layer POL may be disposed on the sensing layer SSL. The polarization layer POL may polarize light. Accordingly, the polarization layer POL may reduce reflection of external light. The adhesive layer OCA may be disposed on the polarization layer POL, and may adhere the polarization layer POL and the window WIN. However, in another embodiment, the polarization layer POL and the adhesive layer OCA may be omitted. The window WIN may be disposed on the adhesive layer OCA and may protect the display panel PNL.

The display device 1000 may include the substrate 100 and the printed circuit board 300. The substrate 100 may include the display part 110 and the pad part 130 protruding from the display part 110. The width of the pad part 130 may decrease as the distance from the display part 110 increases. The printed circuit board 300 may have the concave-convex shape, and the concave-convex shape may be formed or provided along the shape of the pad part 130. The printed circuit board 300 may be disposed by the space between the pad part 130. In other words, the pad part 130 and the printed circuit board 300 may be disposed to be engaged with each other. Accordingly, the dead space DS of the display device 1000 may be reduced.

Figure 5:
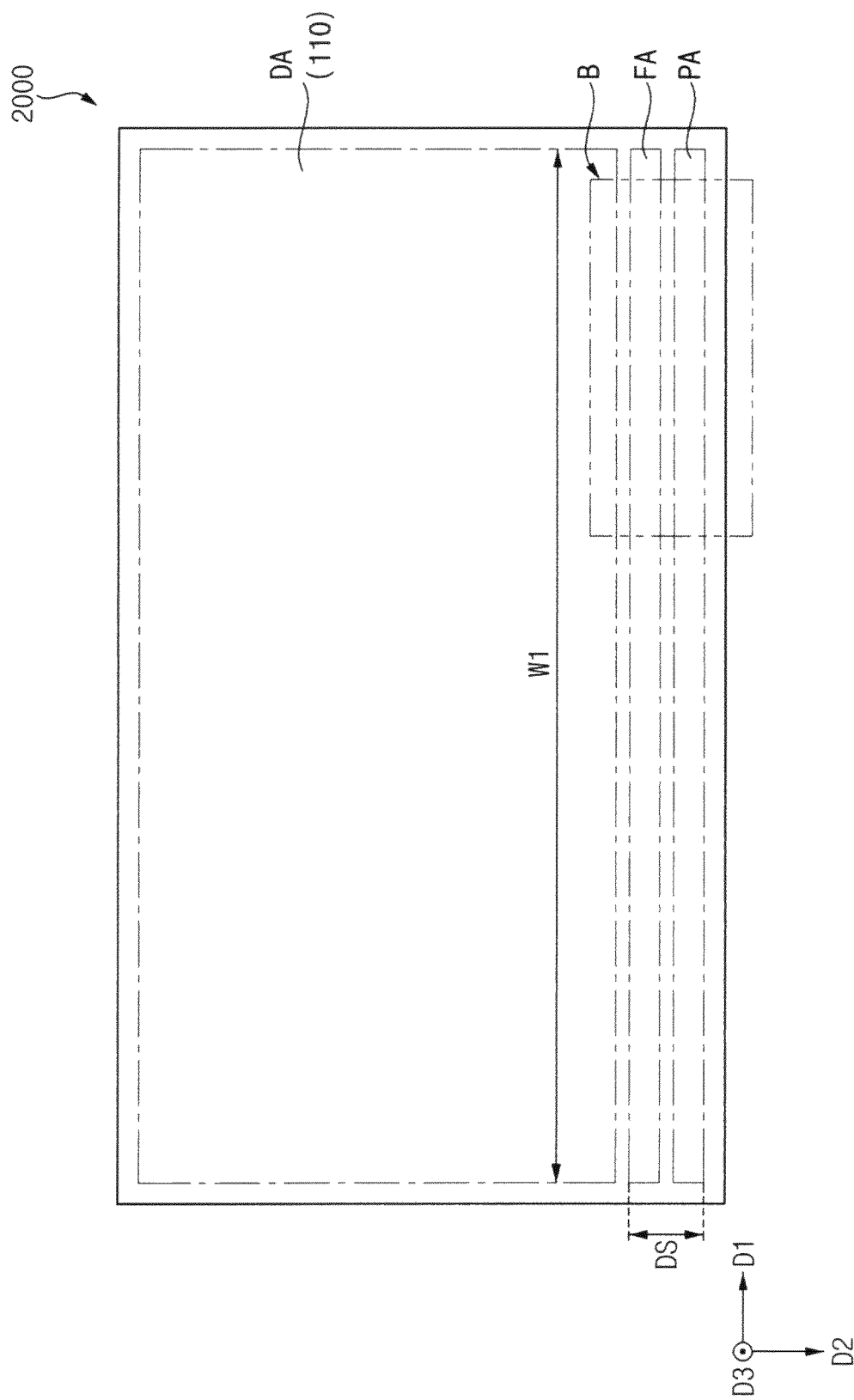
FIG. 5 is a plan view illustrating another embodiment of a display device.
Figure 6:
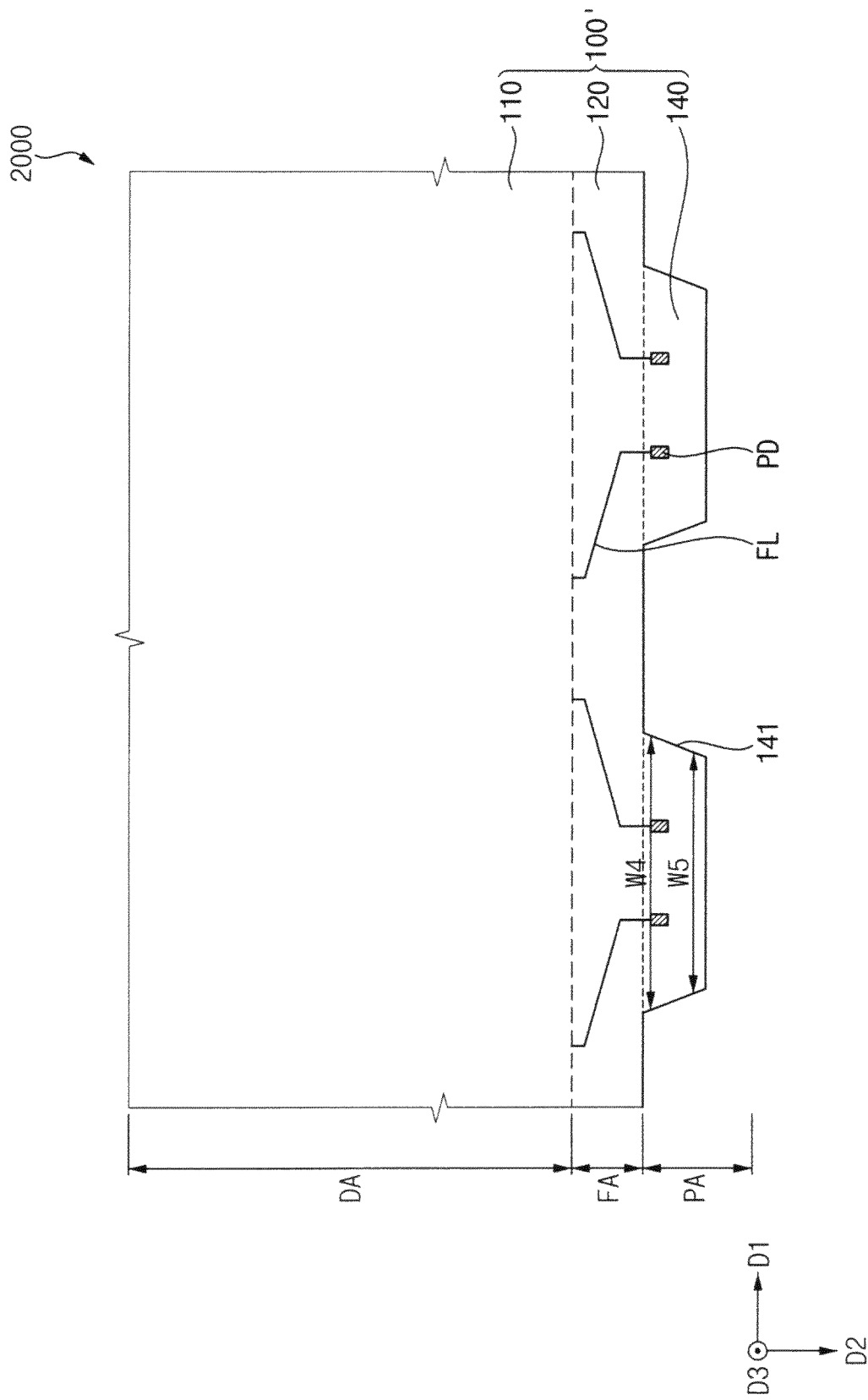
FIG. 6 is an enlarged view illustrating a substrate included in the display device of FIG. 5.
Figure 7:
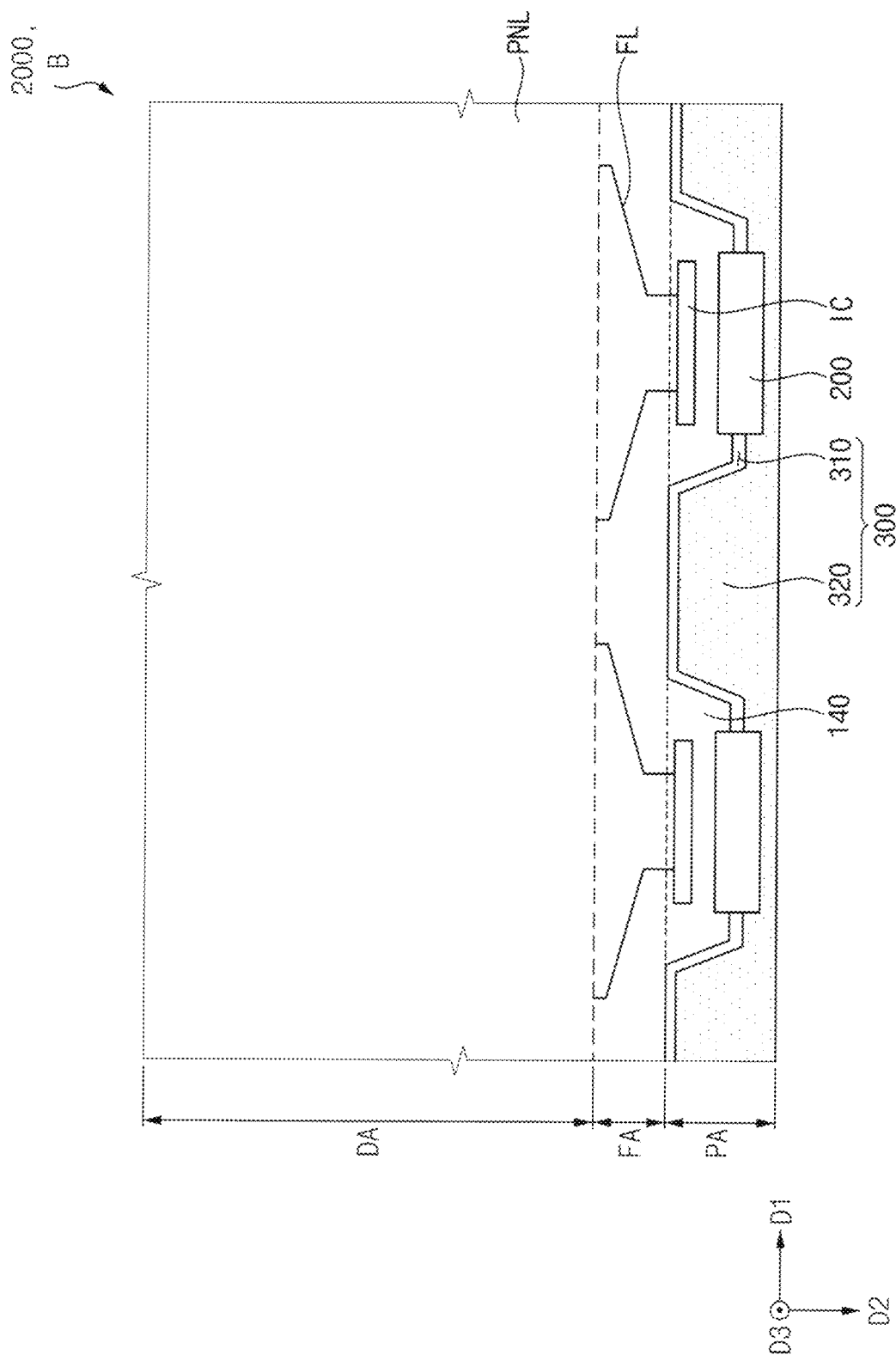
FIG. 7 is an enlarged view illustrating the display device of FIG. 5.

FIG. 5 is a plan view illustrating another embodiment of a display device. FIG. 6 is an enlarged view illustrating a substrate included in the display device of FIG. 5. FIG. 7 is an enlarged view illustrating the display device of FIG. 5. FIG. 7 is an enlarged view of area "B" of FIG. 5, for example.

Referring to FIG. 5, a display device 2000 in another embodiment may include a display area DA, a fan-out area FA, and a pad area PA. However, the display device 2000 may be substantially the same as the display device 1000 described with reference to FIG. 1 except for the substrate 100'.

Referring to FIGS. 6 and 7, the display device 2000 may include the substrate 100'. The substrate 100' may include a display part 110, a fan-out part 120, and a pad part 140. However, the display part 110 and the fan-out part 120 may be substantially the same as the display part 110 and the fan-out part 120 described with reference to FIG. 2. Hereinafter, the pad part 140 will be described.

The pad part 140 may overlap the pad area PA. In an embodiment, the pad part 140 may protrude from the display part 110 in the second direction D2. The pad PD may be disposed on the pad part 140. The pad PD may be electrically connected to the fan-out line FL. In other words, the pad part 140 may be electrically connected to the display part 110 through the pad PD and the fan-out line FL.

The display part 110, the fan-out part 120, and the pad part 140 may be unitary. In other words, the substrate 100' may be formed or provided by cutting a quadrangular (e.g., rectangular) mother substrate having a larger area than that of the substrate 100'. In the process of cutting the mother substrate, the substrate 100' may be formed or provided such that the substrate 100' includes the pad part 140 described above.

In an embodiment, the pad part 140 may have a fourth width W4 and a fifth width W5. The fourth width W4 may be a width of the pad part 140 adjacent to the fan-out part 120, and the fifth width W5 may be a width of the pad part 140 spaced apart from the fan-out part 120. As shown in FIGS. 1 and 5, the fourth width W4 and the fifth width W5 may be smaller than the first width W1 of the display part 110.

In an embodiment, in a plan view, the pad part 140 may have a trapezoidal shape. In an embodiment, the width of the pad part 140 in the first direction D1 may decrease as the distance from the display part 110 increases. In other words, the fifth width W5 may be smaller than the fourth width W4.

In addition, in an embodiment, the side 141 of the trapezoidal shape may be a straight line. Accordingly, the rigidity of the pad part 130 may be improved.

The display device 2000 may include the substrate 100' and the printed circuit board 300. The substrate 100' may include the display part 110 and the pad part 140 protruding from the display part 110. The width of the pad part 140 may decrease as the distance from the display part 110 increases. The printed circuit board 300 may have the concave-convex shape, and the concave-convex shape may be formed or provided along the shape of the pad part 140. The printed circuit board 300 may be disposed by the space between the pad parts 140. In other words, the pad part 140 and the printed circuit board 300 may be disposed to be engaged with each other. Accordingly, the dead space DS of the display device 2000 may be reduced.

Figure 8:
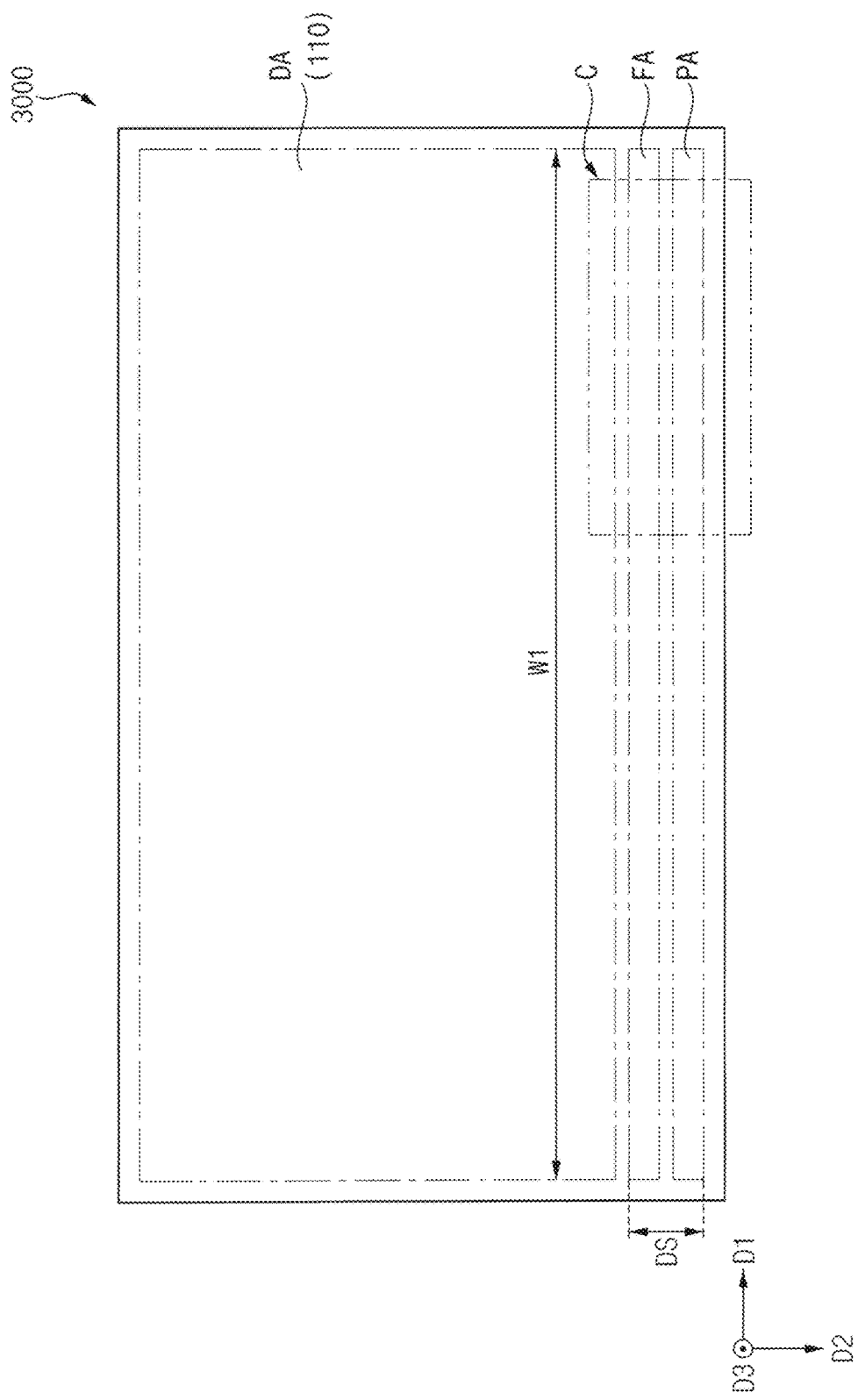
FIG. 8 is a plan view illustrating another embodiment of a display device.
Figure 9:
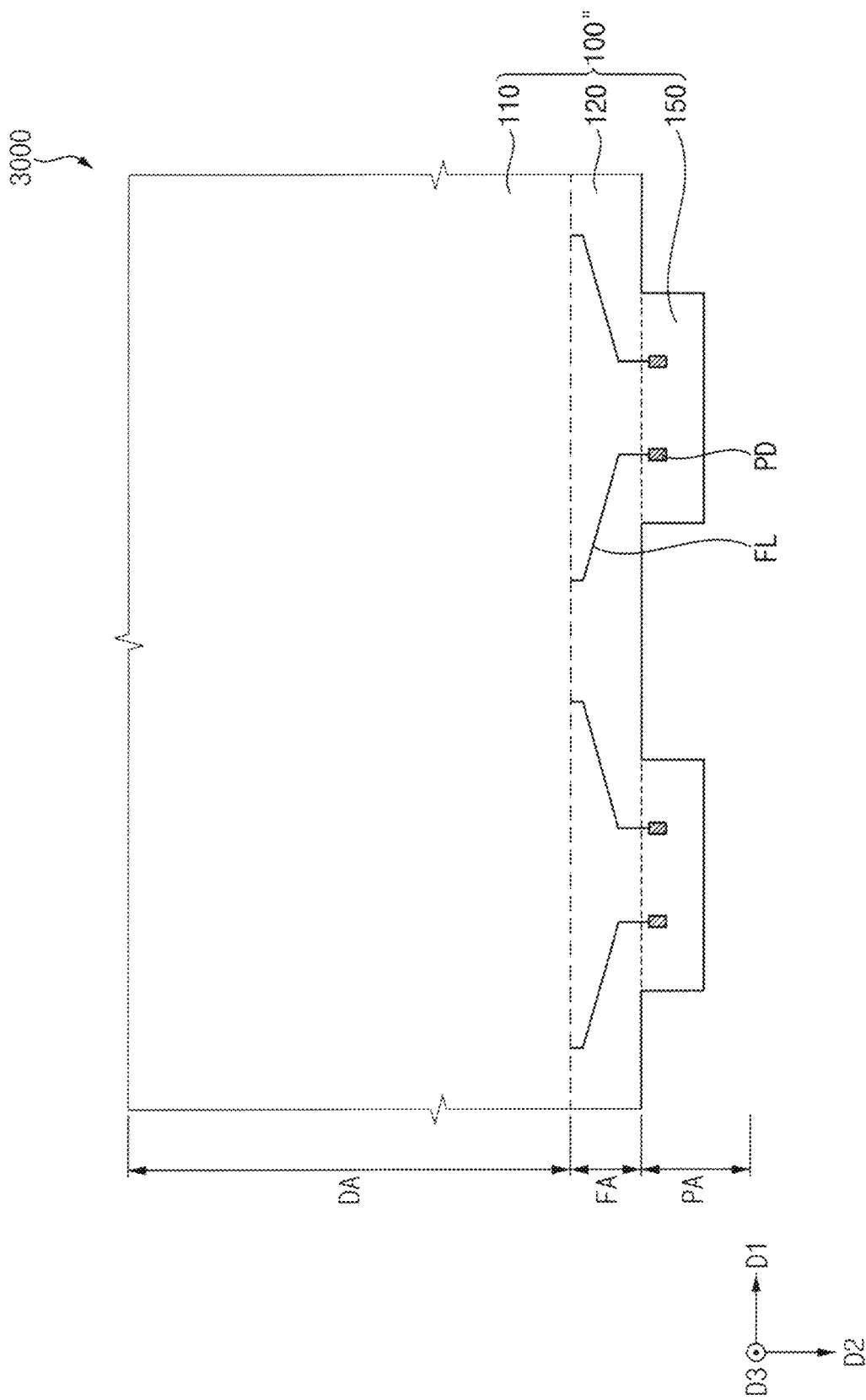
FIG. 9 is an enlarged view illustrating a substrate included in the display device of FIG. 8.
Figure 10:
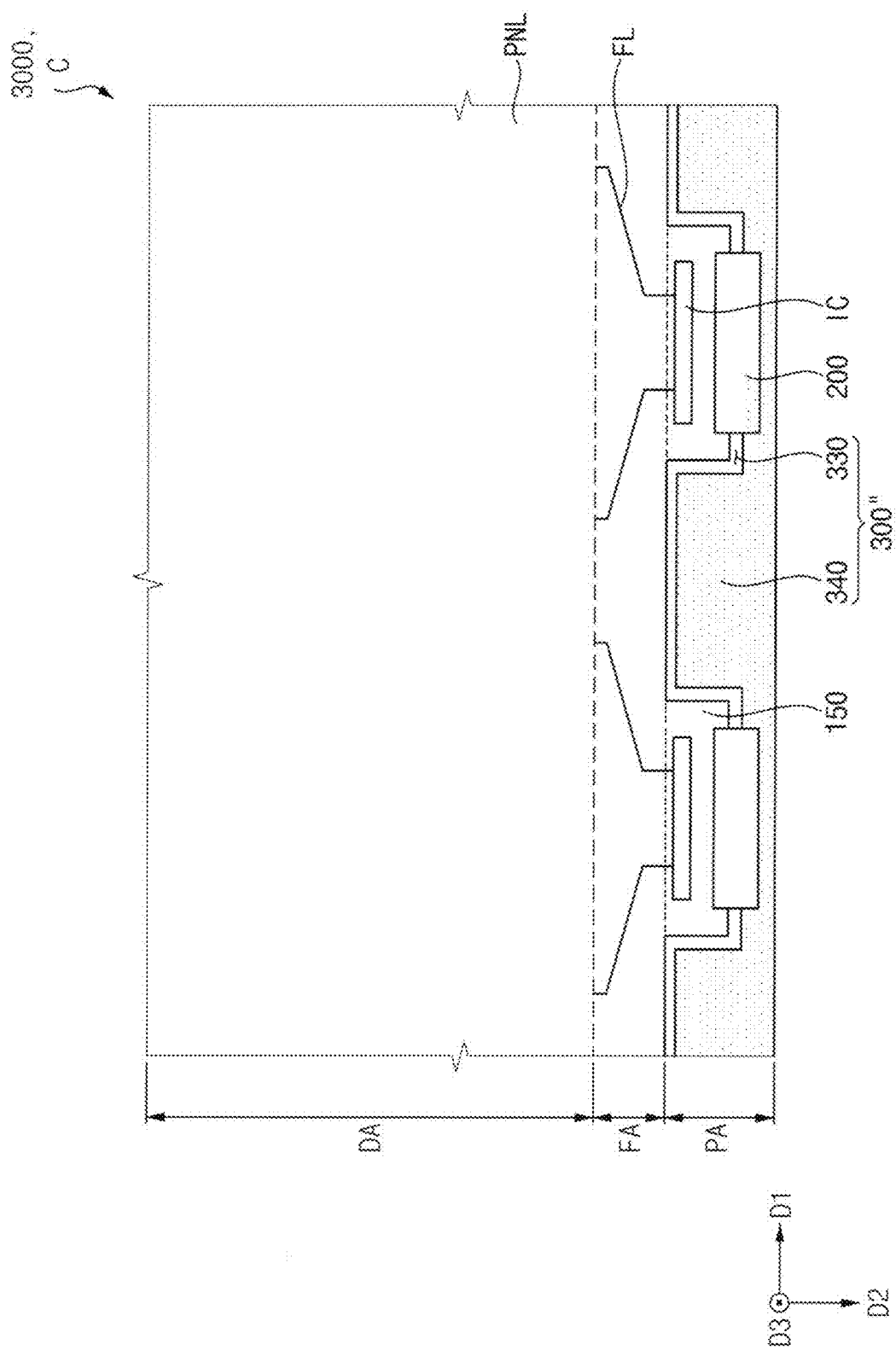
FIG. 10 is an enlarged view illustrating the display device of FIG. 8.

FIG. 8 is a plan view illustrating another embodiment of a display device. FIG. 9 is an enlarged view illustrating a substrate included in the display device of FIG. 8. FIG. 10 is an enlarged view illustrating the display device of FIG. 8. FIG. 10 is an enlarged view of area "C" of FIG. 8, for example.

Referring to FIG. 8, a display device 3000 in another embodiment may include a display area DA, a fan-out area FA, and a pad area PA. However, the display device 3000 may be substantially the same as the display device 1000 described with reference to FIG. 1 except for the substrate 100" and the printed circuit board 300".

Referring to FIGS. 9 and 10, the display device 3000 may include the substrate 100" and the printed circuit board 300".

The substrate 100" may include a display part 110, a fan-out part 120, and a pad part 150. However, the display part 110 and the fan-out part 120 may be substantially the same as the display part 110 and the fan-out part 120 described with reference to FIG. 2. Hereinafter, the pad part 150 will be described.

The pad part 150 may overlap the pad area PA. In an embodiment, the pad part 150 may protrude from the display part 110 in the second direction D2. The pad PD may be disposed on the pad part 150. The pad PD may be electrically connected to the fan-out line FL. In other words, the pad part 150 may be electrically connected to the display part 110 through the pad PD and the fan-out line FL.

The display part 110, the fan-out part 120, and the pad part 150 may be unitary. In other words, the substrate 100" may be formed or provided by cutting a quadrangular (e.g., rectangular) mother substrate having a larger area than that of the substrate 100". In the process of cutting the mother substrate, the substrate 100" may be formed or provided such that the substrate 100" includes the pad part 150 described above.

In an embodiment, in a plan view, the pad part 150 may have a quadrangular (e.g., rectangular) shape. In an embodiment, the width of the pad part 150 in the first direction D1 may be constant, for example.

The printed circuit board 300" may overlap the pad area PA of the display device 3000. The printed circuit board 300" may be electrically connected to the driving chip IC and may include a timing control circuit, a power supply circuit, or the like. In addition, the printed circuit board 300" may further include a communication circuit for connecting the display device 3000 to an external device (e.g., GPU).

In an embodiment, the printed circuit board 300" may be adjacent to the pad part 150 in the second direction D2. In addition, the printed circuit board 300" may include a concave-convex shape towards the substrate 100". In other words, the printed circuit board 300" may include the concave-convex shape facing the pad part 150. In an embodiment, one surface of the printed circuit board 300" may have the concave-convex shape, and the other surface of the printed circuit board 300" may have a straight shape, for example.

The concave-convex shape may be formed or provided along the shape of the pad part 150. In an embodiment, the concave-convex shape may include a concave portion 330 and a convex portion 340, for example.

The concave portion 330 may overlap the pad part 150 in the second direction D2. In an embodiment, the concave portion 330 may be a space in which the pad part 150 is disposed, for example. In addition, as shown in FIG. 10, the concave portion 330 may have a quadrangular (e.g., rectangular) shape.

The convex portion 340 may be spaced apart from the pad part 150 in the second direction D2 and may overlap the pad part 150 in the first direction D1. In an embodiment, the convex portion 340 may be a portion protruding toward the substrate 100", for example. In addition, as shown in FIG. 10, the convex portion 340 may have a quadrangular (e.g., rectangular) shape.

The display device 3000 may include the substrate 100" and the printed circuit board 300". The substrate 100" may include the display part 110 and the pad part 150 protruding from the display part 110. The printed circuit board 300" may have the concave-convex shape, and the concave-convex shape may be formed or provided along the shape of the pad part 150. The printed circuit board 300" may be disposed by the space between the pad part 150. In other words, the pad part 150 and the printed circuit board 300" may be disposed to be engaged with each other. Accordingly, the dead space DS of the display device 3000 may be reduced.

Although the embodiments and implementations have been described herein, other embodiments and modifications will be apparent from this description. Accordingly, the invention is not limited to such embodiments, but rather to the broader scope of the appended claims and various obvious modifications and equivalent arrangements as would be apparent to a person of ordinary skill in the art.

What is claimed is:

1. A display device comprising:
   a substrate including:
      a display part having a first width in a first direction; and
      a pad part protruding from the display part in a second direction crossing the first direction and having a second width in the first direction, the second width being smaller than the first width;
      a fan-out part disposed between the display part and the pad part and including a fan-out line electrically connecting the display part and the pad part;
      a pad disposed inside the pad part in a plan view and to which an end of a fan-out line is connected; and
   a printed circuit board adjacent to the substrate in the second direction and having a concave-convex shape towards the substrate,
   wherein the concave-convex shape includes:
      a convex portion spaced apart from the pad part in the second direction in a manner that an entirety of the convex portion does not overlap the pad part in a plan view.

2. The display device of claim 1, wherein in a view, the pad part has a trapezoidal shape.

3. The display device of claim 2, wherein the second width of the pad part in the first direction decreases as a distance from the display part increases.

4. The display device of claim 1, wherein the pad part has a trapezoidal shape with a straight side surface.

5. The display device of claim 4, wherein the second width of the pad part in the first direction decreases as a distance from the display part increases.

6. The display device of claim 1, wherein the pad part has a rectangular shape.

7. The display device of claim 1, wherein the pad part is electrically connected to the display part.

8. The display device of claim 1, wherein the concave-convex shape includes:
   a concave portion overlapping the pad part in the second direction.

9. The display device of claim 8, wherein the convex portion overlaps the pad part in the first direction.

10. The display device of claim 8, wherein the concave-convex shape is provided along a shape of the pad part.

11. The display device of claim 10, wherein the convex portion has a trapezoidal shape with a straight side surface.

12. The display device of claim 10, wherein the convex portion has a rectangular shape.

13. The display device of claim 1, further comprising:
   a flexible printed circuit board connecting the substrate and the printed circuit board.

14. The display device of claim 13, wherein the flexible printed circuit board is disposed at an end portion of the pad part.

15. The display device of claim 1, further comprising:
a transistor disposed on the display part and electrically connected to the pad part;
a first electrode disposed on the transistor and electrically connected to the transistor;
an emission layer disposed on the first electrode; and
a second electrode disposed on the emission layer.

\* \* \* \* \*